United States Patent [19]
Bjornholt

[11] Patent Number: 6,114,987
[45] Date of Patent: Sep. 5, 2000

[54] DUAL-LOOP LINEARIZER FOR FM-CW RADAR

[75] Inventor: John E. Bjornholt, Fountain Hills, Ariz.

[73] Assignee: Sensor Technologies & Systems, Inc., Scottsdale, Ariz.

[21] Appl. No.: 09/321,677

[22] Filed: May 29, 1999

[51] Int. Cl.[7] .............................. G01S 13/32; H03L 7/22
[52] U.S. Cl. ............................... 342/200; 342/103; 331/4
[58] Field of Search .................................. 342/103, 200; 331/2, 4, 18, 25, 34, 178

[56] References Cited

U.S. PATENT DOCUMENTS

| | | | |
|---|---|---|---|
| 4,692,766 | 9/1987 | Rolfs | 342/200 |
| 5,210,539 | 5/1993 | Voyce | 331/4 |
| 5,694,132 | 12/1997 | Johnson | 342/200 |

*Primary Examiner*—Ian J. Lobo
*Attorney, Agent, or Firm*—Donald Wenskay

[57] ABSTRACT

A system and method for generating a linear frequency sweep while also improving the phase noise characteristics of a microwave or millimeter wave signal source. The invention uses two phase lock loops. The first phase lock loop uses a linear frequency source to linearize a relatively low frequency VCO (typically around 100 MHz). The first phase lock loop has a bandwidth that is only wide enough to pass the radar modulation waveform with minimal distortion. The first phase lock loop includes a phase detector, narrow band loop filter, low noise HF VCO and a divide by M counter. The second phase lock loop is used to lock a millimeter wave VCO to the lower frequency of the low frequency VCO in the first loop. The low phase noise characteristics of this low frequency VCO are effectively impressed upon a microwave or millimeter wave, low noise high frequency VCO. The low noise high frequency VCO output from the first phase lock loop becomes the reference input for the second phase lock loop, which includes a phase detector, wide band loop filter, millimeter wave (MMW) VCO a local oscillator, mixer, amplifier/filter and a divide by R counter. The MMW VCO output is the FM-CW radar transmitted signal.

18 Claims, 3 Drawing Sheets

DUAL-LOOP LINEARIZER FOR FM-CW RADAR

FIELD OF THE INVENTION

The present invention relates to the field of radar systems, and more particularly to a dual-loop linearizer for FM-CW Radar systems.

BACKGROUND OF THE INVENTION

Radar systems generally produce a radio frequency signal that is transmitted in a desired direction using a high gain, narrow beam width antenna. A small portion of the transmitted signal is reflected back from the target in the antenna beam and is received by the radar, generally using the same antenna that transmitted the signal. The time delay between the transmitted signal and the received "echo" is a function of the two-way distance from the radar to the target divided by the speed of light. This time delay is about two nanoseconds per foot.

In the case of radar systems requiring short range and high resolution, frequency modulated continuous wave (FM-CW) radars are preferred. In these radars, the transmitted signal is swept in frequency during the detection interval (typically a few milliseconds) over a fairly wide frequency bandwidth (typically several hundred megahertz). Also, transmit and receive functions occur simultaneously in FM-CW radars. In traditional pulse radars the transmit and receive functions are not simultaneous. Because of the finite time delay to the target and back the echo from a target is slightly different in frequency from what is currently being transmitted. The process of mixing the transmitted signal with the echo in the radar receiver generates a beat frequency that is proportional to the target range if certain criteria are met.

There are two factors related to the radar transmitted signal quality that are very critical for optimum performance. These are linearity of the frequency sweep vs. time and phase noise, sometimes referred to as phase jitter. For example, assume the radar sweeps 500 MHz of bandwidth in two milliseconds, which corresponds to 500 Hz every two nanoseconds, thus 500 Hz for each foot of range. A target 100 feet from the radar would generate a beat frequency of 100×500=50 kHz. If the frequency vs. time slope deviated from its nominal 500 MHz per two milliseconds during the sweep, the beat frequency would deviate proportionately.

This nonlinearity would have two deleterious effects. First, it would lower the signal-to-noise ratio because the signal was "smeared" over multiple frequencies. Second, it would make it difficult or impossible to separate or "resolve" multiple targets that were closely spaced, negating the advantages of using a wide bandwidth in the first place. Thus, it is important to maintain strict linearity. One example of a circuit that improves linearity by using a single her phase lock loop is found in U.S. Pat. No. 5,374,903, which is incorporated herein by reference. However, in this approach phase noise remains a problem.

The second factor, phase noise control, is an integral process with linearization of the frequency sweep. The effect of high phase noise is that radar returns from close-in targets or reflections from the antenna mix with the transmitted signal to raise the noise floor, thereby making it difficult, or impossible to reliably detect small targets at long ranges. A device known as a voltage-controlled oscillator (VCO) is the basic element used in most FM-CW radars to generate the desired swept frequency output. Because of the need to tune over wide bandwidths to achieve the desired range resolution, microwave and millimeter wave VCOs are inherently noisy and often limit the radar performance. It is thus desirable to reduce the phase noise of the free-running VCO by phase locking it to a lower frequency, much lower noise source. By reducing the phase noise at offset frequencies in the range of interest, the performance of the radar can be increased to levels limited only by thermal noise instead of being phase noise limited.

SUMMARY OF THE INVENTION

A system and method for generating a linear frequency sweep while also improving the phase noise characteristics of a microwave or millimeter wave signal source. The invention uses two phase lock loops. The first phase lock loop uses a linear frequency source to linearize a relatively low frequency VCO (typically around 100 MHz). The first phase lock loop has a bandwidth that is only wide enough to pass the radar modulation waveform with minimal distortion. The first phase lock loop includes a phase detector, narrow band loop filter, low noise HF VCO and a divide by M counter. The second phase lock loop is used to lock a millimeter wave VCO to the lower frequency of the low frequency VCO in the first loop. The low phase noise characteristics of this low frequency VCO are effectively impressed upon a microwave or millimeter wave, low noise high frequency VCO. The low noise high frequency VCO output from the first phase lock loop becomes the reference input for the second phase lock loop, which includes a phase detector, wide band loop filter, millimeter wave (MMW) VCO a local oscillator, mixer, amplifier/filter and a divide by R counter. The MMW VCO output is the FM-CW radar transmitted signal.

BRIEF DESCRIPTION OF THE FIGURES

The various advantages of the invention will become apparent to one skilled in the art by reading the following specification and by reference to the following drawings.

DETAILED DESCRIPTION OF THE DRAWINGS

The following description relates to an improved linearizer for FM-CW radar systems. Although the diagrams and description of the preferred embodiment of the invention herein disclose one embodiment of the invention, many other embodiments are possible and are considered to be within the teachings of the present invention.

Figure 1:
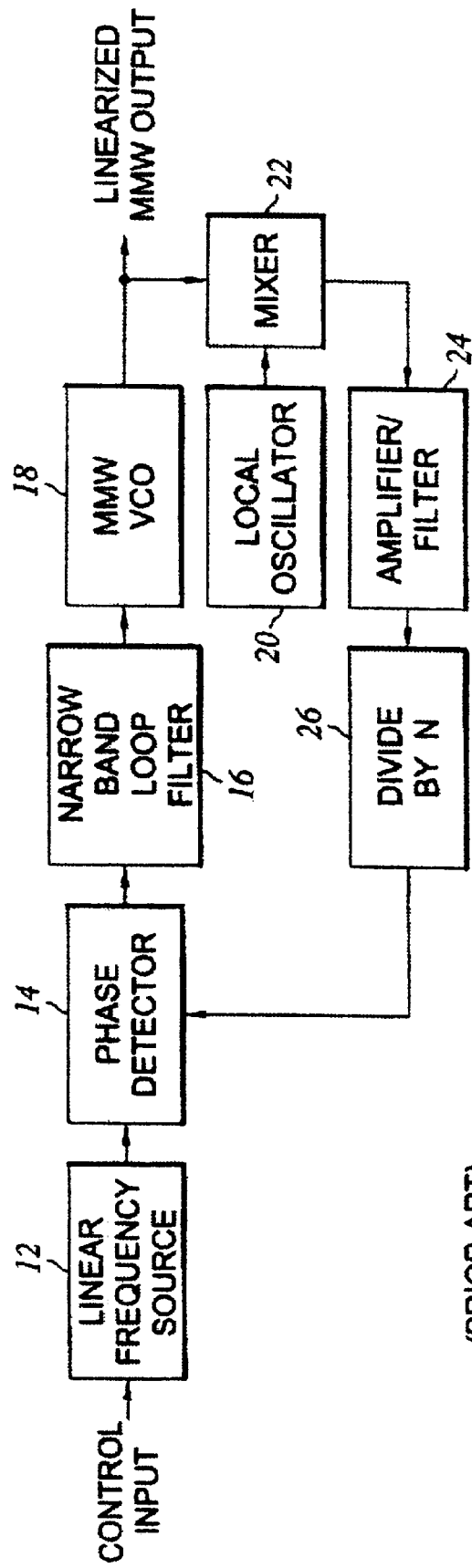
FIG. 1 shows a block diagram of a single loop linearizer for FM-CW radar in accordance with the prior art.

FIG. 1 shows a single loop linearizer 10 for a FM-CW radar in accordance with the prior art. It includes a linear frequency source 12, a phase detector 14, a narrow band loop filter 16, a MMW VCO 18, a local oscillator 20, a mixer 22, an amplifier filter 24 and a divide by N counter 26. Additional details of a linearizer of this type can be found in U.S. Pat. No. 5,374,903 discussed above. For purposes of the discussion of the present invention it should be noted that the value of N in the divide by N counter is relatively large. If a the linear frequency source 12 generates an output in the 1–2 MHz range, and a 500 MHz sweep is desired by the MMW VCO 18, then N must be 500. The phase noise of the linear frequency source normalized to the millimeter wave output must be multiplied by N. For this example, this would be a 500 fold noise increase (54 dB) that would result in phase noise at least as poor as the free-running MMW VCO, if allowed to control the MMW VCO at offset frequencies of interest. However, because the phase detector 14 sampling frequency is low (about 1 MHz), it is physically impossible for the loop bandwidth to be wide enough to affect the MMW VCO 18 phase noise at offset frequencies of interest. Thus the output phase noise of the system is essentially equal to the free-running MMW VCO phase noise.

Figure 2:
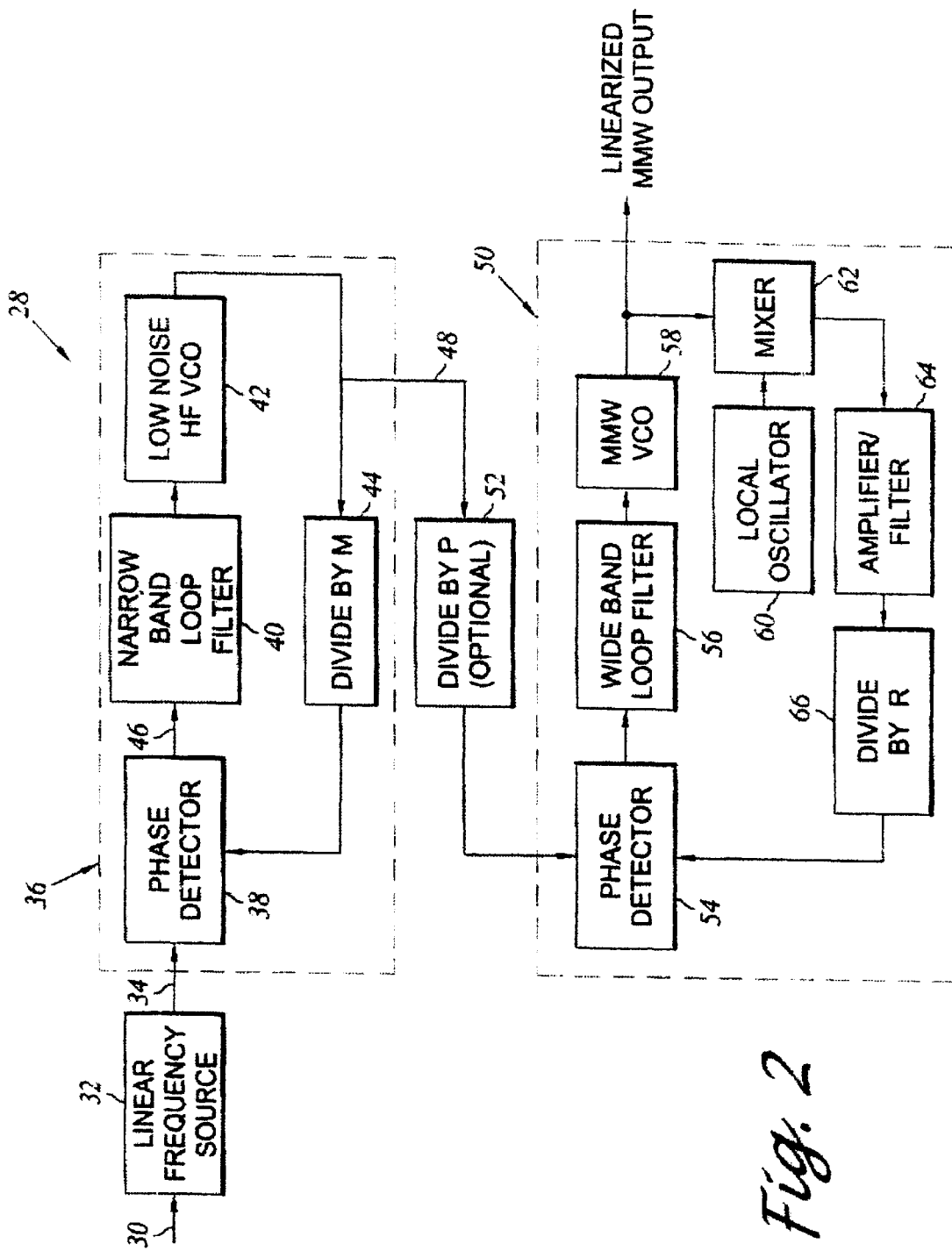
FIG. 2 shows a block diagram of a dual loop linearizer for FM-CW radar in accordance with the present invention.

FIG. 2 shows a block diagram of the dual loop linearizer 28 in accordance with the invention. A control input 30 enables a linear frequency source 32, which produces an output 34, that is a waveform with linear frequency vs. time characteristics. These frequencies will typically be within the 1–2 MHz range. This output 34 is the input to a first phase lock loop 36. The linear frequency source 32 may use one of several techniques to generate the desired swept frequency in the megahertz region at output 34. One technique is known as direct digital synthesis, and is described in the aforementioned U. S. Pat. No. 5,374,903. Another technique is to use a voltage-to-frequency converter (VFC), which is commonly used in digital multimeters for performing analog-to-digital conversion. The linearity of a VFC is typically 0.1 percent or better, making it well suited to the linearity requirements of FM-CW radars. Many other techniques are possible to generate a linearly swept frequency. However the two techniques mentioned above are capable of generating linear swept frequencies a few megahertz wide, whereas the radar ultimately may need to sweep several hundred megahertz. Thus, some technique is needed to effectively multiply the sweep width. Phase lock loops are an effective way to provide this multiplication. However, the direct digital synthesis technique typically has relatively high spurious outputs and the VFC approach typically has relatively poor phase noise. Accordingly, it is not desirable to impress the spurious and/or phase noise characteristics of either of these sources onto the microwave or millimeter wave VCO Instead, it would be desirable to only impress the excellent linearity characteristics of either approach on to the microwave or millimeter wave VCO.

The first phase lock loop 36, receives the linear swept frequency signal output 34 and processes it using a phase detector 38, a narrow band loop filter 40, a low noise high (HF) frequency VFO 42 and a divide by M digital counter 44. The VCO typically operates around 100 MHz and, when divided by M (typically an even binary number, for example 64), provides the feedback signal into the phase detector 38. The phase detector 38 may comprise a digital device which is sensitive to both frequency and phase differences. It compares the feedback signal to the reference signal from the linear frequency source 32 and provides an error signal 46 to the narrow band loop filter 40. The error signal 46 is amplified and filtered by the narrow band loop filter 40 and then applied to the low noise HF VCO 42 to control its frequency.

A typical bandwidth for the low noise HF VCO 42 might be selected to be 50 MHz, thus sweeping the range of 75 MHz to 125 MHz. The linear frequency source 32, in this case needs to sweep a range M times smaller, or 1.17 to 1.95 MHz if M is 64. The length of the sweep waveform (in time) is typically a few milliseconds and may be a sawtooth or triangle waveform depending on the FM-CW radar design. The bandwidth of the first phase lock loop to support the FM sweep rate without appreciable distortion would typically be about ten times the sweep frequency, typically 5 to 10 kHz. Inside this bandwidth, the VCO 42 will take on the phase noise characteristics of the linear source, normalized by the factor $20 \times \log_{10} M$. Outside this bandwidth, the phase noise will essentially approach the free running VCO phase noise. For a typical 100 MHz VCO such as Model POS-150 manufactured by Mini-Circuits Corp., the phase noise is less than −120 dBc/Hz at an offset of 100 kHz from the carrier.

The low noise HF VCO output from the first phase lock loop 36 becomes the reference input for a second phase lock loop 50. This output 36 may optionally be divided by a value (P) by a divide by P counter 50. The second phase lock loop consists of a phase detector 54, wide band loop filter 56, MMW VCO 58, local oscillator 60, mixer 62, amplifier/filter 64 and divide by R counter 66. The MMW VCO 58 output is essentially the FM-CW radar transmitted signal, which is also used as the mixer drive for the radar systems receiver (not shown). A portion of the MMW VCO 58 is coupled off and down-converted by the combination of the local oscillator 60 and mixer 62 to a frequency that is compatible with current digital counters. The local oscillator 60 is a fixed frequency device operating just above or below the range of the MMW VCO 58. Because the frequency of the local oscillator 60 is fixed, its phase noise is typically 20 dB lower than the MMW VCO 58. This is important, because it is necessary for the mixer 62 output to substantially reflect only the phase noise characteristics of the MMW VCO 58.

Since the mixer 62 output is low amplitude and contains undesirable harmonics, an amplifier/filter 64 is used to condition the mixer 62 output before applying it to the divide by R counter 66. The divide by R counter output 66 supplies the feedback signal to the phase detector 54, where it is compared to the reference signal from the first loop (low noise HF VCO 42). The divide by P counter is needed only if the phase detector 54 requires the low noise HF VCO output to be conditioned into a digital signal. The value of P could simply be one. The value R is the factor by which the sweep width of the low noise HF VCO 42 is multiplied to obtain the sweep width of 10×50=500 MHz.

The bandwidth of the second loop can be relatively wide because the phase detector sampling rate is high (tens of megahertz). A nominal loop bandwidth of several megahertz is thus possible, thereby forcing the second loop 50 to track the low phase noise reference from the low noise HF VCO.

It should be noted that the phase noise of the low noise HF VCO 42 must be multiplied by the factor R to normalize it to the second loop output. In decibels, this increase is $20 \times \log_{10} R$, or in the case where R is ten, 20 dB, However, even a 20 dB increase in phase noise of the low noise HG VCO 42 normalized to the MMW VCO 58 results in a phase noise level of less than −100 dBc/Hz at 100 kGz offset. This is significantly lower than the free-running phase noise of the MMW VCO 58. For example, a millimeter wave VCO at 76.5 GHz capable of tuning 500 MHz bandwidth has a phase noise level of typically −70 dBc/Hz at 100 kHz offset. Thus, it can be seen that the second loop has the capability of reducing the output phase noise to levels equivalent to the local oscillator 60, a 20 dB improvement over previous techniques which use only a single narrow band loop.

Figure 3:
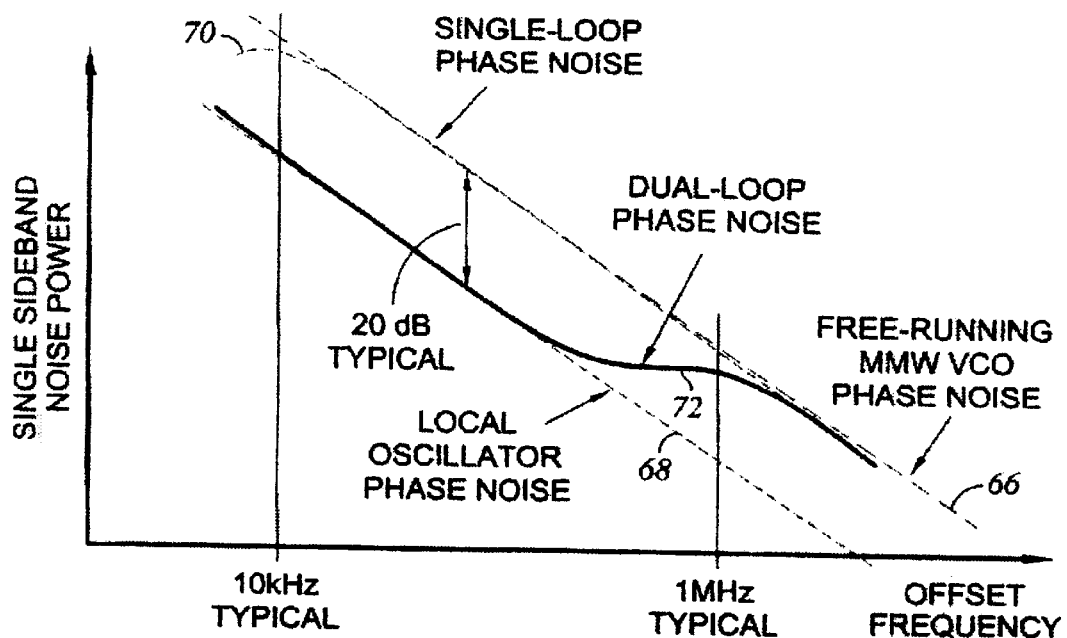
FIG. 3 shows a graph of the phase noise of dual loop and single loop linearizers.

FIG. 3 graphically illustrates the phase noise improvement using the dual loop linearizer 28 of the present invention. The free-running phase noise of a typical microwave or millimeter wave VCO is shown by line 66. Line 68 shows the phase noise of the fixed frequency local oscillator 50. With the single loop linearizer 10, no phase noise improvement is possible at offset frequencies of general interest to the radar system (10 kHz to several hundred kilohertz), as shown by line 70. Since the dual loop linearizer 28 has a much wider bandwidth (shown as 1 MHz, for example), its composite phase noise curve 72 essentially approaches the level of the local oscillator. This is typically 20 dB better than the single loop design.

Figure 4:
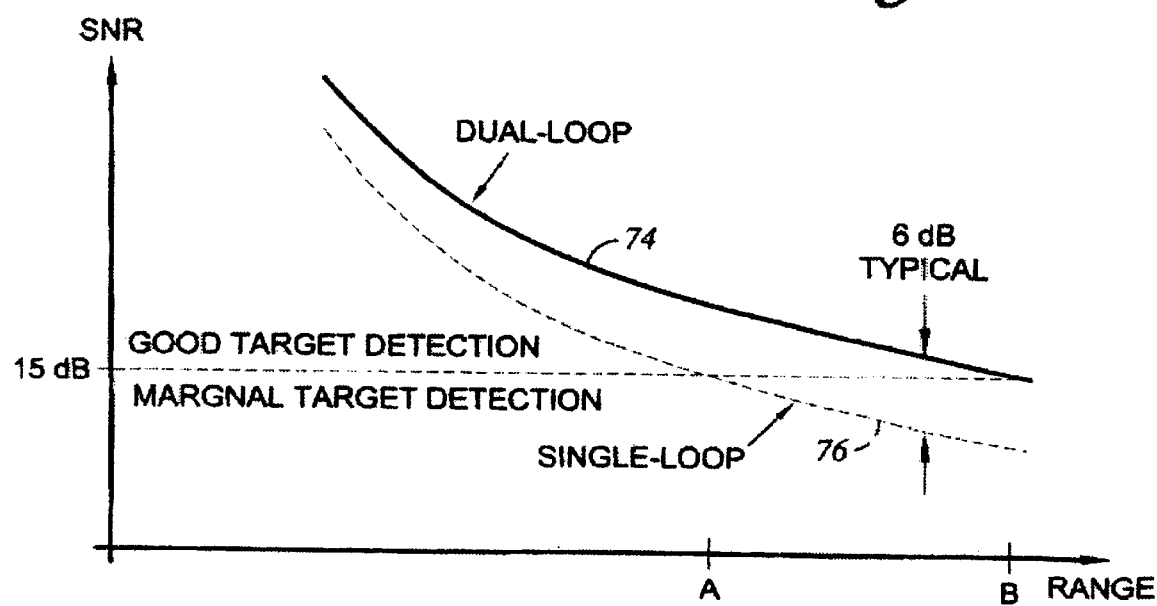
FIG. 4 shows a graph of the signal-to-noise ratio improvement in a typical radar using a dual loop versus a single loop linearizer.

FIG. 4 shows the relative effect of phase noise improvement on the performance of an exemplary millimeter wave FM-CW radar. Line 74 shows the signal-to-noise curve for the dual loop system of the invention, and line 76 shows the signal-to-noise curve for a conventional single loop system. The net result is that the radar is no longer phase noise limited but instead limited by theoretical thermal noise. The 6 dB improvement shown in FIG. 4 represents an almost 50 percent increase in detection range. That is, the target detection capabilities of the single loop system become marginal at range A, while the dual loop linearizer of the invention maintains acceptable target detection up to range B, which is approximately 50 percent greater than range A. Of course, there are many other factors that affect overall performance, so varying degrees of improvement using the dual loop linearizer may accrue depending on the specific radar system.

Numerous modifications to and alternative embodiments of the present invention will be apparent to those skilled in the art in view of the foregoing description. Accordingly, this description is to be construed as illustrative only and is for the purpose of teaching those skilled in the art the best mode of carrying out the invention. Details of the structure and method may be varied substantially without departing from the spirit of the invention and the exclusive use of all the modifications which come within the scope of the appended claims is reserved.

What is claimed is:

1. A linearizer for a frequency modulated-continuous wave (FM-CW) radar system comprising:
   a first multiplying phase lock loop including,
   a first voltage controlled oscillator,
   a linear frequency source generating a reference signal,
   a first divider circuit coupled to the first voltage controlled oscillator and dividing its output by a first predetermined value,
   a phase detector receiving as inputs the divider circuit output and the reference signal, the phase detector generating an error signal, said error signal being coupled to the first voltage controlled oscillator input, wherein the error signal controls the frequency of the first voltage controlled oscillator output, thereby linearizing the output of the first voltage controlled oscillator; and
   a second phase lock loop including,
   a second voltage controlled oscillator generating a linearized output,
   a local oscillator,
   a mixer receiving the second voltage controlled oscillator and local oscillator outputs and generating an output,
   a second divider circuit receiving the mixer output and dividing its frequency by a second predetermined value,
   a phase detector receiving the first phase lock loop output and the second divider output and generating an error signal that derives the second voltage controlled oscillator thereby controlling the frequency of its output.

2. A linearizer according to claim 1 wherein the first voltage controlled oscillator is a low phase noise high frequency voltage controlled oscillator.

3. A linearizer according to claim 2 wherein the first voltage controlled oscillator is a voltage controlled oscillator operating at about 100 MHz and having a phase noise less than about −120 dBc/Hz.

4. A linearizer according to claim 1 wherein the linear frequency source sweeps a frequency in the range that is smaller than the range of the first voltage controlled oscillator by a factor equal to the first predetermined value.

5. A linearizer according to claim 1 further comprising a first filter for amplifying and filtering the error signal before it is received by the first voltage controlled oscillator.

6. A linearizer according to claim 5 wherein the first filter is a narrow band loop filter.

7. A linearizer according to claim 1 further comprising a third divider circuit receiving the output of the first phase lock loop and dividing its frequency by a third predetermined value.

8. A linearizer according to claim 1 further comprising a second filter coupled to the mixer output for filtering and amplifying the mixer output.

9. A frequency modulated continuous wave (FM-CW) radar system comprising:
   a first multiplying phase lock loop including,
   a first voltage controlled oscillator,
   a linear frequency source generating a reference signal,
   a first divider circuit coupled to the first voltage controlled oscillator and dividing its output by a first predetermined value,
   a phase detector receiving as inputs the divider circuit output and the reference signal and generating an error signal, said error signal being coupled to the first voltage controlled oscillator input, wherein the error signal controls the frequency of the first voltage controlled oscillator output, thereby linearizing the output of the first voltage controlled oscillator; and
   a second phase lock loop including,
   a second voltage controlled oscillator generating a linearized output,
   a local oscillator,
   a mixer receiving the second voltage controlled oscillator and local oscillator outputs and generating an output,
   a second divider circuit receiving the mixer output and dividing its frequency by a second predetermined value,
   a phase detector receiving the first phase lock loop output and the second divider output and generating an error signal that derives the second voltage controlled oscillator controlling the frequency of its output.

10. A radar system according to claim 9 wherein the first voltage controlled oscillator is a low phase noise high frequency voltage controlled oscillator.

11. A radar system according to claim 10 wherein the first voltage controlled oscillator is a voltage controlled oscillator operating at about 100 MHz and having a phase noise less than about −120 dBc/Hz.

12. A radar system according to claim 9 wherein the linear frequency source sweeps a frequency in the range that is smaller than the range of the first voltage controlled oscillator by a factor equal to the first predetermined value.

13. A radar system according to claim 9 further comprising a first filter for amplifying and filtering the error signal before it is received by the first voltage controlled oscillator.

14. A radar system according to claim 13 wherein the first filter is a narrow band loop filter.

15. A radar system according to claim 9 further comprising a third divider circuit receiving the output of the first phase lock loop and dividing its frequency by a third predetermined value.

16. A radar system according to claim 9 further comprising a second filter coupled to the mixer output for filtering and amplifying the mixer output.

17. A method of linearizing a swept frequency signal in a radar system comprising the steps of:

provviding a linear frequency source;

providing a first phase lock loop having a first VCO, wherein the first phase lock loop has a relatively narrow bandwidth that is wide enough to pass a radar modulation waveform with minimal distortion;

linearizing the first VCO using the phase lock loop;

providing a second phase lock loop including a second VCO having a higher frequency than the first VCO;

locking the second VCO to the lower frequency first VCO by down-converting the second VCO by a fixed frequency, low noise millimeter wave local oscillator, wherein the wide bandwidth of the second phase lock loop impresses the low noise characteristics of the first VCO onto the second VCO.

18. The method according to claim 17 wherein the first VCO is a low noise high frequency VCO and the second VCO is a millimeter wave VCO.

* * * * *